United States Patent
Chaichanavong et al.

(10) Patent No.: US 8,812,929 B1
(45) Date of Patent: Aug. 19, 2014

(54) DETECTING INSERTION/DELETION USING LDPC CODE

(75) Inventors: Panu Chaichanavong, Mountain View, CA (US); Xueshi Yang, Cupertino, CA (US); Gregory Burd, San Jose, CA (US); Shumei Song, Santa Clara, CA (US)

(73) Assignee: Marvell International Ltd., Hamilton (BM)

( * ) Notice: Subject to any disclaimer, the term of this patent is extended or adjusted under 35 U.S.C. 154(b) by 29 days.

(21) Appl. No.: 13/443,411

(22) Filed: Apr. 10, 2012

Related U.S. Application Data

(63) Continuation of application No. 12/540,995, filed on Aug. 13, 2009, now Pat. No. 8,181,084.

(60) Provisional application No. 61/088,881, filed on Aug. 14, 2008.

(51) Int. Cl.
*G06F 11/00* (2006.01)

(52) U.S. Cl.
USPC ........................................... 714/758

(58) Field of Classification Search
USPC ................................. 714/758, 759
See application file for complete search history.

(56) References Cited

U.S. PATENT DOCUMENTS

| 3,144,635 | A | 8/1964 | Brown et al. |
| 5,459,741 | A | 10/1995 | Iwamura |
| 2004/0098659 | A1 | 5/2004 | Bjerke et al. |
| 2004/0194007 | A1* | 9/2004 | Hocevar ........................ 714/801 |
| 2005/0154957 | A1* | 7/2005 | Jacobsen ....................... 714/752 |
| 2007/0089019 | A1* | 4/2007 | Tang et al. ..................... 714/752 |
| 2008/0201631 | A1* | 8/2008 | Tillich et al. .................. 714/807 |
| 2009/0019335 | A1* | 1/2009 | Boyer et al. ................... 714/755 |
| 2009/0106626 | A1* | 4/2009 | Hou et al. ...................... 714/758 |
| 2010/0241934 | A1* | 9/2010 | Kuri et al. ...................... 714/785 |

OTHER PUBLICATIONS

Bernhard M.J. Leiner, "LDPC Codes—a brief Tutorial", Apr. 8, 2005, retrieved from: http://www2.engr.arizona.edu/~ece506/readings/project-reading/5-ldpc/LDPC_Intro.pdf.*

* cited by examiner

*Primary Examiner* — Yair Leibovich

(57) ABSTRACT

Systems and methods are provided that use LDPC codes to determine the locations of insertions or deletions within bit-strings of information transmitted through communication channels and which notify a LDPC decoder of the locations of the insertions or deletions prior to the start of the decoding process. The use of such systems and methods, according to this disclosure, may improve LDPC decoder performance by reducing errors cause by insertions and/or deletions. The use of such systems and methods, according to this disclosure, may also provide improved application performance and larger data transmission rates.

20 Claims, 7 Drawing Sheets

$$H = \begin{bmatrix} H_1 & 0 & 0 & H_7 & 0 & 0 & H_{13} & 0 & H_{17} & 0 \\ H_2 & H_3 & 0 & 0 & 0 & H_{11} & 0 & 0 & 0 & H_{19} \\ 0 & H_4 & 0 & H_8 & H_9 & 0 & 0 & H_{15} & 0 & 0 \\ 0 & 0 & H_5 & 0 & 0 & H_{12} & 0 & H_{16} & H_{18} & 0 \\ 0 & 0 & H_6 & 0 & H_{10} & 0 & H_{14} & 0 & 0 & H_{20} \end{bmatrix}$$

FIG. 4A

DETECTING INSERTION/DELETION USING LDPC CODE

CROSS-REFERENCE TO RELATED APPLICATIONS

This application is a continuation of, and claims benefit of and priority to, co-pending, commonly assigned, U.S. patent application Ser. No. 12/540,995, filed Aug. 13, 2009, and the benefit under 35 U.S.C. §119(e) of U.S. Provisional Application No. 61/088,881, filed Aug. 14, 2008, each of which is hereby incorporated by reference herein in its respective entirety.

BACKGROUND OF THE DISCLOSURE

This disclosure relates generally to data decoding, and more particularly to iterative decoders for data encoded with a low-density parity check (LDPC) encoder.

With the continuing demand for high-reliability transmission of information in digital communication and storage systems, and with the rapid increase in available computational power, various coding and decoding techniques have been investigated and applied to increase the performance of these systems. One such coding technique, low-density parity check (LDPC) coding, was first proposed in the 1960s, but was not generally used until the 1990s when researchers began to investigate iterative coding and decoding techniques.

LDPC codes are among the few known error control coding techniques capable of transmitting information at a rate close to the Shannon limit or channel-capacity. LDPC codes may be used in the transmission of information on media, or channels. LDPC coding techniques are generally iterative in nature, and may be represented by many different types of parity check matrices. The structure of an LDPC code's parity check matrix may be, for example, random, cyclic, or quasi-cyclic. LDPC codes defined by quasi-cyclic parity check matrices are particularly common and computationally efficient. These codes are known as quasi-cyclic low density parity check (QC-LDPC) codes.

A LDPC decoder may decode LDPC codes using an iterative message passing algorithm, such as a min-sum decoding algorithm. Such algorithms may decode a received vector from a communication channel using an iterative process in which each iteration includes two update steps.

Some communications channels may make bit-strings of information transmitted through them have undesirable insertions or deletions. For example, patterned-media recording channels are one such type of communication channels. In such channels, undesirable insertions or deletions may occur. For example, insertions or deletions may occur when the velocity of a recording device is different than that of a reading device for patterned-media. As an illustrative example, a bit-string "0010111001110101100" may be transmitted on such a channel. The bit-string may suffer from an insertion or a deletion while being transmitted through the communication channel. The received bit-string may have an inserted bit (an insertion). For example, a bit may have been inserted after the $7^{th}$ bit in the originally transmitted bit-string. Therefore, the received bit-string may be "0010111100111 0101100." The received bit-string may have a deleted bit (a deletion). For example, the $13^{th}$ bit in the originally transmitted bit-string may be deleted. Therefore, the received bit-string may be "0010111100111101100." Such insertions or deletions may disadvantageously lead to degraded application performance for applications utilizing the communications channel. Such insertions or deletions may also lead to lowered data transmission rates.

LDPC codes may be used to transmit information in communication channels that are prone to bit insertions or deletions. LDPC codes may be used to determine the locations of insertions or deletions in bit-strings of information transmitted through such channels. Once the locations of such insertions or deletions are known, a LDPC decoder may be pre-emptively notified of the locations prior to the start of the LDPC decoding process. This knowledge of the locations of insertions or deletions may help avoid errors in the decoding process brought about by the insertions or deletions. Therefore, it would be desirable to provide systems and methods which use LDPC codes to determine the locations of insertions or deletions within bit-strings of information transmitted through communication channels and which notify a LDPC decoder of the locations of the insertions or deletions prior to the start of the decoding process. Such systems and methods may lead fewer errors in the decoding process, which may improve application performance for applications utilizing the communication channel. Such systems and methods may also lead to larger data transmission rates.

SUMMARY OF THE DISCLOSURE

Accordingly, systems and methods are disclosed that use LDPC codes to determine the locations of insertions or deletions within bit-strings of information transmitted through communication channels and which notify a LDPC decoder of the locations of the insertions or deletions prior to the start of the decoding process. The use of such systems and methods, according to this disclosure, may improve LDPC decoder performance by reducing errors caused by insertions and/or deletions. The use of such systems and methods, according to this disclosure, may also provide improved application performance and larger data transmission rates.

Embodiments are provided for locating a set of positions associated with a deletion in a received vector using a parity check matrix associated with a low density parity check (LDPC) codeword in a LDPC decoder. In particular, for each bit position of the received vector of bits, a bit may be inserted in that position to create an altered vector of bits. Next, at least one parity check equation associated with a row of the parity check matrix may be evaluated using the altered vector to determine if the equation is violated (i.e. not equal to zero) or satisfied (i.e. equal to zero). The number of violated parity check equations for the altered vector is determined. The number violated parity check equations associated with the row may be compared with the number of violated parity check equations associated with other rows or a threshold number of violated parity check equations. This may be done to locate the set of positions associated with the deletion in the received vector using decoding circuitry.

Embodiments are also provided for locating a set of positions associated with an insertion in a received vector using a parity check matrix associated with a low density parity check (LDPC) codeword in a LDPC decoder. In particular, for each bit position of the received vector of bits, a bit may be deleted from that position to create an altered vector of bits. Next, at least one parity check equation associated with a row of the parity check matrix may be evaluated using the altered vector to determine if the equation is violated (i.e. not equal to zero) or satisfied (i.e. equal to zero). The number of violated parity check equations for the altered vector is determined. The number violated parity check equations associated with the row may be compared with the number of violated parity check equations associated with other rows or a threshold number of violated parity check equations. This may be done to locate the set of positions associated with the insertion in the received vector using decoding circuitry.

BRIEF DESCRIPTION OF THE FIGURES

The above and other aspects and advantages of the invention will be apparent upon consideration of the following detailed description, taken in conjunction with the accompanying drawings, in which like reference characters refer to like parts throughout, and in which:

FIG. 4A shows an illustrative example of a quasi-cyclic parity check matrix in a block matrix representation in accordance with some embodiments;

DETAILED DESCRIPTION OF THE DISCLOSURE

Systems and methods are provided for enhancing the performance of low-density parity check (LDPC) decoders of LDPC codes. In applications or devices where information may be altered by interference signals or other phenomena, error-correction codes, such as LDPC codes, may provide a measured way to protect information against such interference. As used herein, "information" and "data" refer to any unit or aggregate of energy or signals that contain some meaning or usefulness. Encoding may generally refer to the process of generating data in a manner that facilitates subsequent detection and/or correction of errors in the data, while decoding may generally refer to the counterpart process of detecting and/or correcting the errors. The elements of a coding system that perform encoding and decoding are likewise referred to as encoders and decoders, respectively.

Figure 1:
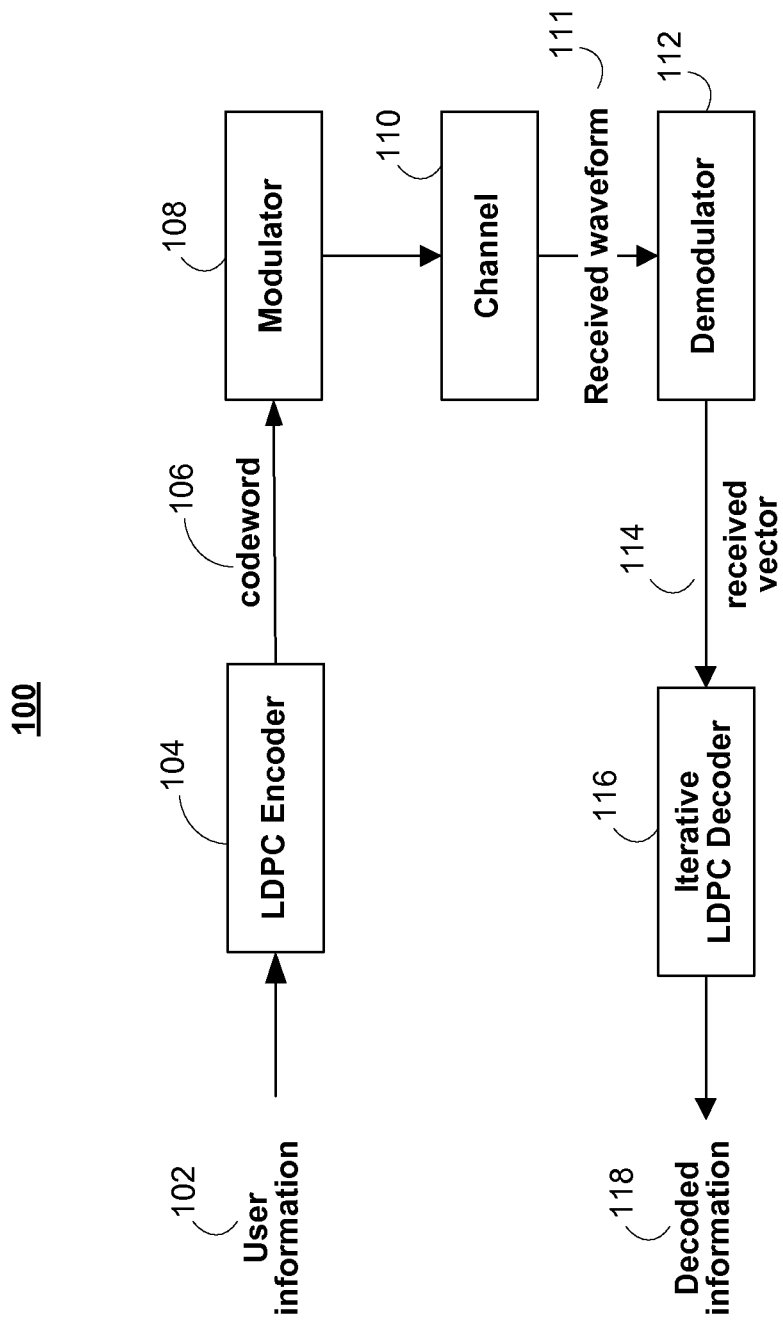
FIG. 1 shows an illustrative block diagram of an error-correcting communication/storage system in accordance with some embodiments.

FIG. 1 shows an illustrative communication or data storage system 100 that utilizes error-correction codes for achieving reliable communication or storage in accordance with some embodiments. User information 102 is encoded through encoder 104. User information 102, often referred to as the message information or a message vector, may be grouped into units of k symbols, where each symbol may be binary, ternary, quaternary, or any other suitable type of data. However, for simplicity, embodiments of the present invention will be described in terms of binary bits. In the process of encoding user information 102, different codes may be used by encoder 104 to achieve different results.

As shown in FIG. 1, encoder 104 may encode user information 102 using a low density parity check (LDPC) code. The result of encoding user information 102 is codeword 106, also denoted as c. Codeword 106 may be of a predetermined length, which may be referred to as n, where n≥k, where k is the number of symbols in user information 102.

In one implementation, codeword 106 is passed to a modulator 108. Modulator 108 prepares codeword 106 for transmission on channel 110. Modulator 108 may use phase-shift keying, frequency-shift keying, quadrature amplitude modulation, or any suitable modulation technique to modulate codeword 106 into one or more information-carrying signals. Channel 110 may represent media through which the information-carrying signals travel. For example, channel 110 may represent a wired or wireless medium in a communication system, or an electrical (e.g., RAM, ROM), magnetic (e.g., a hard disk), or optical (e.g., CD, DVD or holographic) storage medium in which the information-carrying signals may be stored.

Due to interference signals and other types of noise and phenomena, channel 110 may corrupt the waveform transmitted by modulator 108. For example, bit-strings of information transmitted using channel 110 may suffer from insertions or deletions of bits. Such insertions or deletions may occur in, for example, patterned-media recording channels. Thus, received waveform 111, received by demodulator 112, may be different from the originally transmitted signal waveform. Received waveform 111 may be demodulated with demodulator 112. Demodulator 112 may demodulate received waveform 111 with filters, multiplication by periodic functions, or any suitable demodulation technique corresponding to the type of modulation used in modulator 108. The result of demodulation is received vector 114, which may contain errors due to channel corruption.

Received vector 114 may then be processed by LDPC decoder 116. LDPC decoder 116 may be used to correct or detect errors in received vector 114. LDPC decoder 116 may use an iterative message-passing algorithm to correct or detect errors in received vector 114. LDPC decoder 116 may calculate a set of log-likelihood-ratios (also known as soft information or LLRs). For example, LDPC decoder 116 may compute a LLR value using the equation $$LLR(b_i) = \log\left(\frac{P(b_i = 0)}{P(b_i = 1)}\right)$$

for each i, where $b_i$ may represent the $i^{th}$ bit in received vector 114. The LLR value for each bit, $b_i$, may indicate the chance of that received bit being 0 or being 1. Normally, a positive LLR value for a bit, $b_i$, may indicate that the bit is more likely to be 0. Likewise, a negative LLR value for a bit, $b_i$, may indicate that the bit is more likely to be 1. A "hard decision" may be made to determine whether a LLR value for a bit corresponds to the bit being 1 or a bit being 0. A LLR value above zero may indicate, for example, that the corresponding bit is 0 and a LLR value below zero may indicate that the corresponding bit is 1. A LLR value that is zero may correspond to a bit that may be either 0 or 1. For example, the LLR values "−2 3 −5 6 2 1 4 −1 5" may correspond to the hard decisions "1 0 1 0 0 0 0 1 0."

LDPC decoder 116 may use the computed LLR messages in the message passing algorithm. When utilizing such an iterative algorithm, LDPC decoder 116 may perform several iterations of the algorithm until the output of LDPC decoder 116 converges to a valid codeword. In some instances, the output of LDPC decoder 116 may fail to converge to a valid codeword. Decoder failure may be caused by a variety of reasons. Because the output of LDPC decoder 116 may never converge to a valid codeword in certain situations, LDPC decoder 116 may be equipped with a maximum iteration limit, which may be any suitable predetermined number. When LDPC decoder 116 reaches the maximum iteration limit, LDPC decoder 116 may automatically terminate operation and move on to the next received vector 114. However, if the output of LDPC decoder 116 successfully converges to a valid iterative codeword, LDPC decoder 116 may then output decoded information 118.

Figure 2:
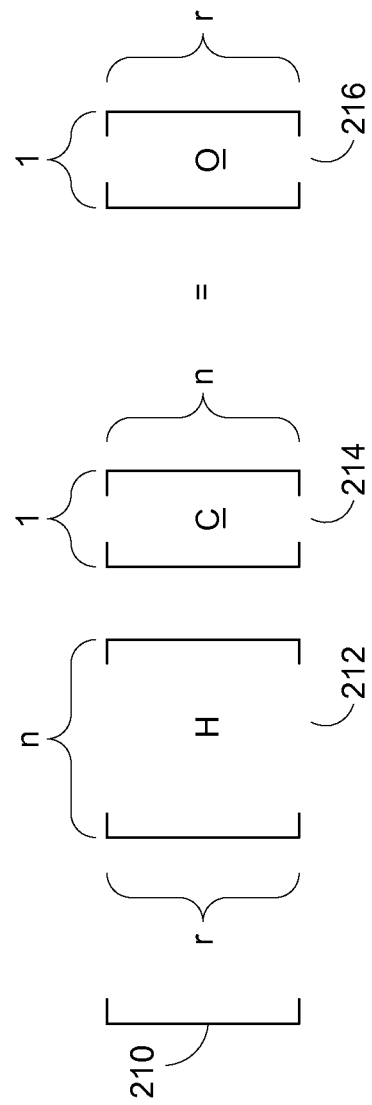
FIG. 2 shows an illustrative example of the properties of a codeword in accordance with some embodiments.

FIG. 2 shows an illustrative example of the properties of codeword 106 of FIG. 1 in accordance with some embodiments. The LDPC codes processed by encoder 104 of FIG. 1 and LDPC decoder 116 of FIG. 1 are conventionally represented by mathematical vector models. In particular, a LDPC code may be described by its parity check matrix H. Equation 210 illustrates parity check matrix 212. Parity check matrix 212 may have many more 0 entries than non-zero entries. Parity check matrix 212 may be of size [r×n], corresponding to codewords of length n and syndromes of length r. Codewords may be, for example, n-length codeword 106 of FIG. 1. Syndrome length r may satisfy the inequality r≥n−k and where k is the length of the information being encoded (e.g., length of user information 102 of FIG. 1).

When parity check matrix 212 is multiplied by codeword 214, the modulo two result may be zero-vector 216. Zero-vector 216 may be a vector of size [r×1] where all elements equal zero. Therefore, the modulo two result of the multiplication of any row of parity check matrix 212 by a vector of size [n×1], such as received vector 114 of FIG. 1, may act as a check sum which is equal to zero when the vector may be a valid codeword and one when the vector may not be a valid codeword. Analogously, any row of parity check matrix 212 may correspond to a "check equation." The check equation corresponding to any row of parity check matrix 212 may be generated by multiplying the row with a vector $[v_1, v_2, \ldots, v_n]^T$, where each $v_i$ may represent a variable corresponding to $i^{th}$ bit position in the vector, and n may correspond to the number of columns in parity check matrix 212. The check equation may be satisfied when its modulo two result is zero, indicating that the vector may be a valid codeword. The check equation may be violated when its modulo two result is one, indicating that the vector may not be a valid codeword.

Parity check matrix 212 is not unique, and may be chosen, for example, to be computationally convenient and/or to decrease the number of errors generated by the message passing algorithm in LDPC decoder 116. As discussed in relation to FIG. 1, codeword 214 may be decoded in LDPC decoder 116 to produce decoded information 118.

For example, the parity check matrix:

$$H = \begin{bmatrix} 1 & 0 & 1 & 0 & 0 & 0 & 1 & 0 & 1 & 0 \\ 1 & 0 & 0 & 1 & 0 & 1 & 0 & 0 & 0 & 1 \\ 0 & 1 & 0 & 1 & 0 & 0 & 0 & 1 & 1 & 0 \\ 0 & 0 & 1 & 0 & 1 & 1 & 0 & 1 & 0 & 0 \\ 0 & 1 & 0 & 0 & 1 & 0 & 1 & 0 & 0 & 1 \end{bmatrix}$$

may describe a particular LDPC code used by a LDPC encoder and a LDPC decoder. For this parity check matrix, the vector $[1, 0, 0, 1, 0, 0, 0, 0, 1, 0]^T$ is a valid codeword. This is because when each row of H is multiplied by this vector, the modulo two result is always 0. However, the vector $[0, 1, 1, 0, 0, 1, 0, 0, 0, 0]^T$ may not be a valid codeword. This is because when each row of H is multiplied by this vector, the modulo two result is not always 0.

Figure 3A:
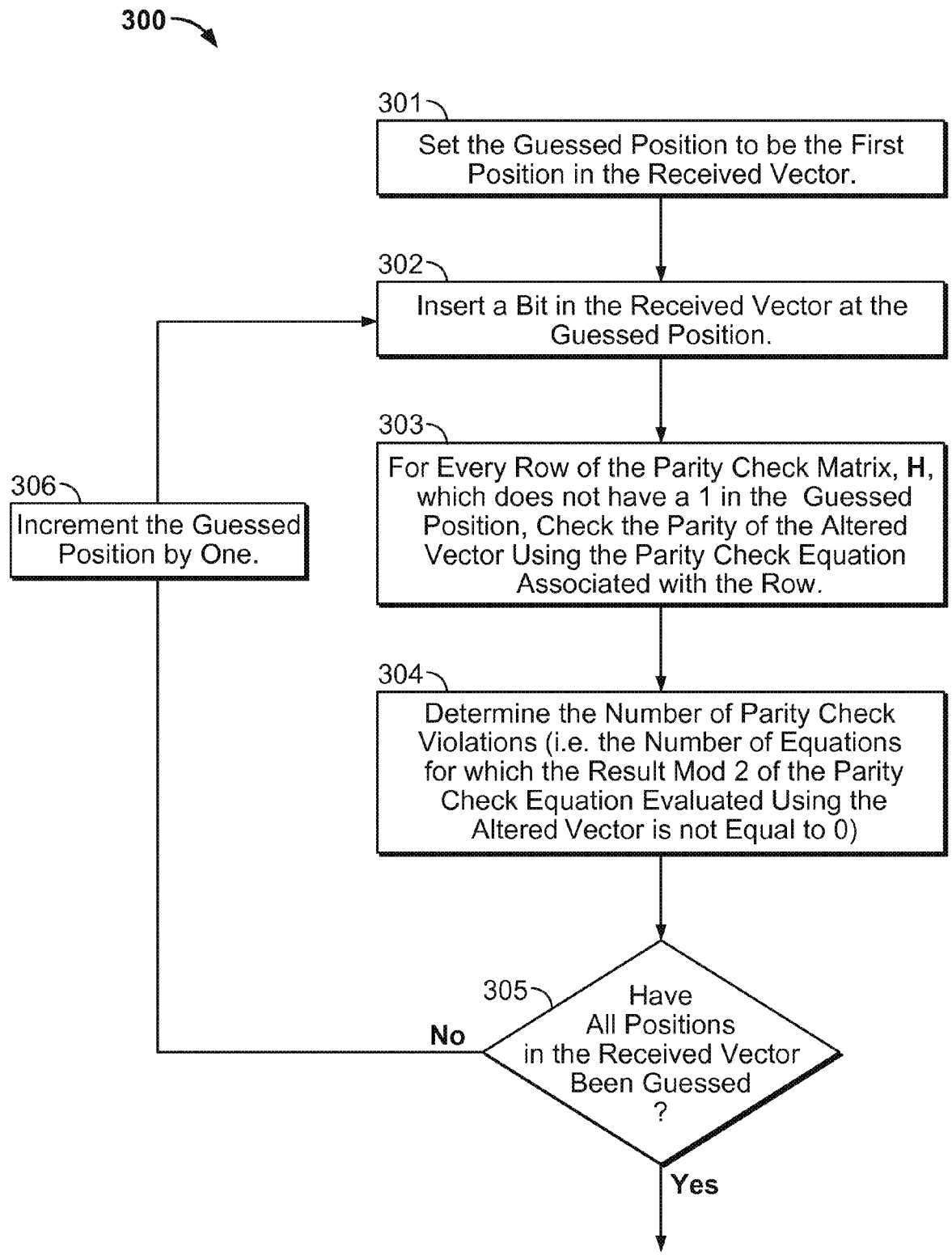
FIG. 3A shows a flowchart of a process for locating a deletion in a received vector using a LDPC parity check matrix in accordance with some embodiments.

FIG. 3A shows a flowchart of process 300 for locating a deletion in a received vector using a LDPC parity check matrix in accordance with some embodiments. Process 300 includes steps 301, 302, 303, 304, 305 and 306. In certain embodiments, process 300 may be used to locate a deleted bit (a deletion) in a received vector, v, which for example, may be received vector 114 of FIG. 1. Process 300 may assume that there may be one deleted bit (a deletion) in received vector, v (e.g. of size [(n−1)×1]). Process 300 may use a parity check matrix H (e.g. of size [r×n]) to determine possible positions where the deletion occurred in v.

At step 301, the first bit position in v may be guessed or considered as a possible position in which the deletion occurred. Therefore, the guessed position may be set to the first bit position.

At step 302, a placeholder bit may inserted into the guessed position in v. This bit may be a '0' or it may be a '1.' The resulting vector may be a vector $\tilde{v}$ (e.g. of size [n×1]).

At step 303, each row of parity check matrix, H, which does not have a 1 in the guessed position may be multiplied by the vector $\tilde{v}$. The result of this may be called a "check sum." For each such row, if the modulo two result of this check sum is 0, then $\tilde{v}$ may possibly be a valid codeword, otherwise $\tilde{v}$ may not be a valid codeword. Analogously, at step 303 each parity check equation, associated with a row of parity check matrix H which does not have a 1 in the guessed position may be evaluated using the vector $\tilde{v}$. The result of this may be called a "parity check." For each such equation, if the modulo two result of this parity check is 0, then the parity check equation may be satisfied and $\tilde{v}$ may be a valid codeword, otherwise the parity check equation may be violated and $\tilde{v}$ may not be a valid codeword.

At step 304, the number parity check violations (i.e. the number of violated parity check equations) for the guessed position may be determined. This may be, for example, equal to the number of parity check equations for which the modulo two result is not 0. In other embodiments, at step 304, the ratio of the number of parity check violations (i.e. the number of violated parity check equations) for the guessed position to the total number of parity check equations associated with rows of parity check matrix H which do not have a 1 in the guessed position may be determined.

At step 305, it may be determined if all possible positions for the deletion in the received vector v have been guessed. If all positions have been guessed then process 300 may be completed. Otherwise, step 306 may be executed.

At step 306, the guessed position may be incremented by one bit position. Process 300 may then execute step 302.

Process 300 may be completed, for example, once all possible guesses of bit positions for the deletion in v have been considered. In some embodiments, the number of violated parity check equations for each possible bit position in v, may be determined. In other embodiments, the ratio of the number of parity check violations for each possible bit position to the total number of parity check equations associated with rows of parity check matrix H which do not have a 1 in the bit position (ratio of parity check violations) may be determined. There may be multiple ways to determine the possible positions where the deletion occurred. For example, in some embodiments, it may be determined that the bit positions corresponding to the smallest number of violated parity check equations may be possible positions where the deletion occurred in v. For example, in other embodiments, it may be determined that the bit position corresponding to the smallest ratio of parity check violations may be possible positions where the deletion occurred in v.

As another example, in some embodiments, it may be determined that the first bit position found corresponding to the number of violated parity check equations being less than a threshold may be the possible position where the deletion occurred in v. There may be many violated parity check equations if the guessed position of the deletion is not the actual position of the deletion. However, there may only be a few violated parity check equations if the guessed position of the deletion is the actual position of the deletion. A threshold may therefore be set for the number of violated parity check equations associated with a guessed position, below which, the guessed position is deemed to be the actual position of the deletion. Using such a threshold may correctly identify the actual position of the deletion and also may reduce the time to search and find this position.

In practice, one or more steps shown in process 300 may be combined with other steps, performed in any suitable order, performed in parallel (e.g., simultaneously or substantially simultaneously), or removed.

For example, suppose that the LDPC encoder (e.g. encoder 104 of FIG. 1) encodes and transmits the codeword $[1, 0, 0, 1, 0, 0, 0, 0, 1, 0]^T$, and a deletion occurs in the second position. Therefore, the received vector $v=[1, 0, 1, 0, 0, 0, 0, 1, 0]^T$. Process 300 may then be used by, for example, LDPC decoder 116, to locate a deletion in v by determining the possible positions where the deletion occurred in v. Process 300 may use the parity check matrix $$H = \begin{bmatrix} 1 & 0 & 1 & 0 & 0 & 0 & 1 & 0 & 1 & 0 \\ 1 & 0 & 0 & 1 & 0 & 1 & 0 & 0 & 0 & 1 \\ 0 & 1 & 0 & 1 & 0 & 0 & 0 & 1 & 1 & 0 \\ 0 & 0 & 1 & 0 & 1 & 1 & 0 & 1 & 0 & 0 \\ 0 & 1 & 0 & 0 & 1 & 0 & 1 & 0 & 0 & 1 \end{bmatrix}$$

to determine the bit position of the deletion in the received vector. First, process 300 may guess that the position of the deletion is in the first bit position of v. Process 300 may then insert a placeholder bit in this first bit position. The placeholder bit may be, for example, a '0'. The result of this may be the vector $\tilde{v}=[0, 1, 0, 1, 0, 0, 0, 0, 1, 0]^T$. In parity check matrix H, the third, fourth, and fifth rows do not have a 1 as the first entry. These three rows may correspond to three different parity check equations in which the first bit position of $\tilde{v}$ does not participate. Out of the three parity check equations corresponding to the third, fourth, and fifth rows of parity check matrix H, only the fourth equation may be satisfied by the vector $\tilde{v}$. The other two parity check equations may be violated by the vector $\tilde{v}$. Process 300 may then increment the guessed location of the deleted bit in v by one bit position.

In this next iteration, process 300 may guess that the position of the deletion is in the second bit position of v. Process 300 may then put a placeholder bit in this second bit position. The placeholder bit may be, for example, a '0'. The result of this may be the vector $\tilde{v}=[1, 0, 0, 1, 0, 0, 0, 0, 1, 0]^T$. In parity check matrix H, the first, second, and fourth rows do not have a 1 as the second entry. These three rows may correspond to three different parity check equations in which the second bit position of $\tilde{v}$ does not participate. The three parity check equations corresponding to the first, second, and fourth rows of parity check matrix H may be satisfied by the vector $\tilde{v}$. Therefore, none of these parity check equations may be violated. Process 300 may then increment the guessed location of the deleted bit in v by one bit position.

Process 300 may be repeated in a similar way until all possible guesses of bit positions for the deletion in v have been considered and the number of violated parity check equations corresponding to each possible bit position of the deletion in v is determined.

TABLE 1

| Bit Position | Number of Violated Parity Check Equations |
|---|---|
| 0 | 2 |
| 1 | 0 |
| 2 | 0 |
| 3 | 2 |
| 4 | 2 |
| 5 | 2 |
| 6 | 2 |
| 7 | 2 |
| 8 | 1 |
| 9 | 1 |

The result of this, as show, for example in Table 1 may be: bit position 0 corresponds to 2 violated parity check equations, bit position 1 corresponds to 0 violated parity check equations, bit position 2 corresponds to 0 violated parity check equations, bit position 3 corresponds to 2 violated parity check equations, bit position 4 corresponds to 2 violated parity check equations, bit position 5 corresponds to 2 violated parity check equations, bit position 6 corresponds to 2 violated parity check equations, bit position 7 corresponds to 2 violated parity check equations, bit position 8 corresponds to 1 violated parity check equation, and bit position 9 corresponds to 1 violated parity check equation. Since, bit positions 1 and 2 have the smallest corresponding values for the number of violated parity check equations, these positions may be identified as possible positions where the deletion occurred in v.

In some embodiments, process 300 may be extended to assist in locating multiple deletions in a received vector v, using a LDPC parity check matrix. For example, the new process may guess that the positions of the two or more deleted bits are correspondingly in two or more bit positions of v. The new process may then insert placeholder bits in these guessed locations. Each placeholder bit may be, for example, a '0' or a '1'. Using the resulting vector, the number of violated parity check equations corresponding to rows of a parity check matrix H which do not have a 1 in the guessed positions may then be determined. The number of violated parity check equations may similarly be determined exhaustively for all possible guesses of positions of deleted bits. In some embodiments, the set of bit positions corresponding to the smallest values for the number of violated parity check equations may be identified as the possible positions where the deletions occurred in v. In other embodiments, it may be determined that the first set of bit positions guessed corresponding to the number of violated parity check equations being less than a threshold may be the possible position where the deletions occurred in v.

Figure 3B:
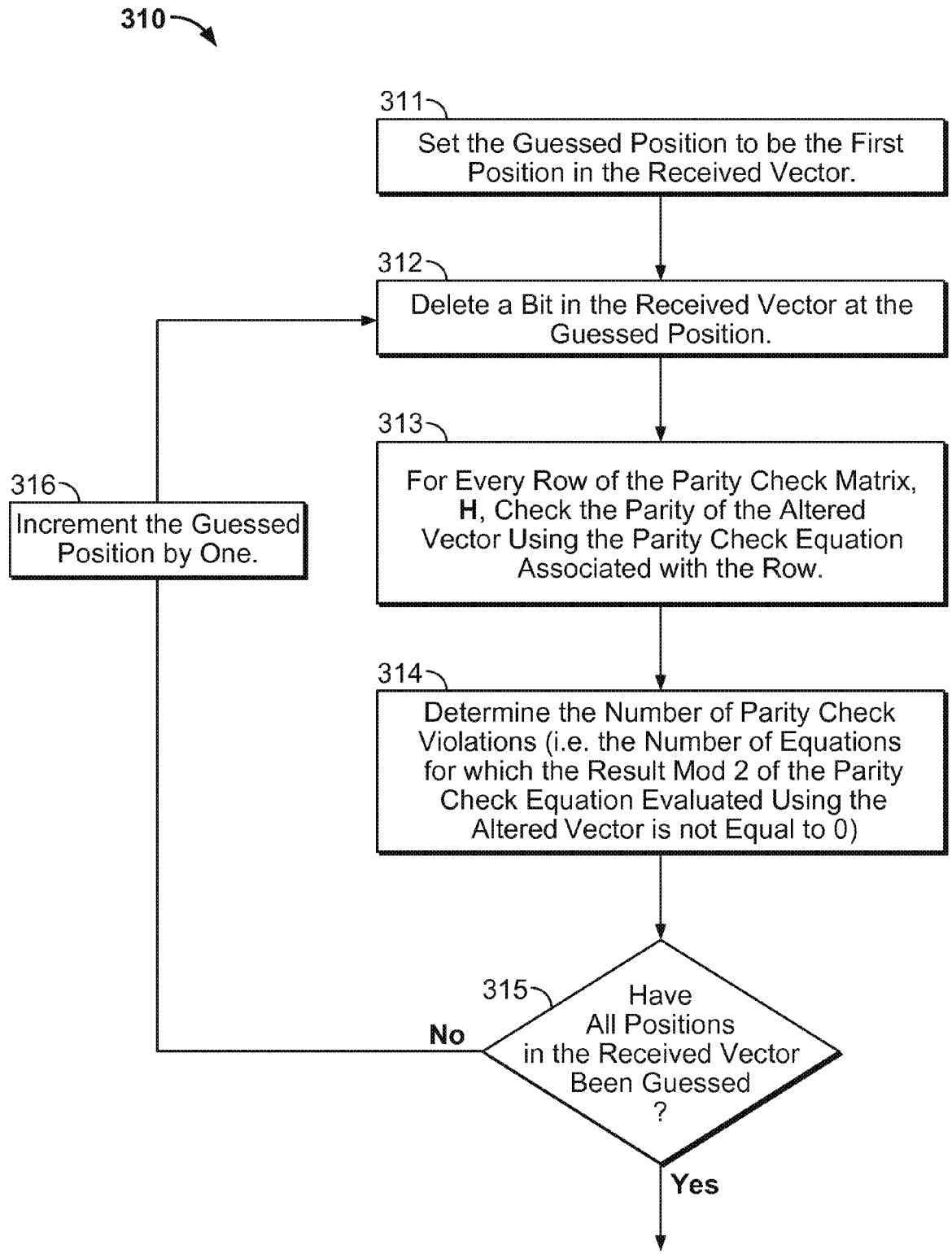
FIG. 3B shows a flowchart of a process for locating an insertion in a received vector using a LDPC parity check matrix in accordance with some embodiments.

FIG. 3B shows a flowchart of process 310 for locating an insertion in a received vector using a LDPC parity check matrix in accordance with some embodiments. Process 310 includes steps 311, 312, 313, 314, 315 and 316. In certain embodiments, process 310 may be used to locate an inserted bit (an insertion) in a received vector, v, which for example, may be received vector 114 of FIG. 1. Process 300 may assume that there may be one inserted bit (an insertion) in received vector, v (e.g. of size $[(n+1)\times 1]$). Process 310 may use a parity check matrix H (e.g. of size $[r\times n]$) to determine possible positions where the insertion occurred in v.

At step 311, the first bit position in v may be guessed or considered as a possible position in which the insertion occurred. Therefore, the guessed position may be set to the first bit position.

At step 312, a bit at the guessed location in v may be deleted. This bit may be a '0' or it may be a '1.' The resulting vector may be a vector ṽ (e.g. of size [n×1]).

In some embodiments, at step 313, each row of parity check matrix H may be multiplied by the vector ṽ. In other embodiments, at step 313, each row of parity check matrix H which does not have a 1 in the guessed position may be multiplied by the vector ṽ. The result of this may be called a "check sum." For each such row, if the modulo two result of this check sum is 0, then ṽ may possibly be a valid codeword, otherwise ṽ may not be a valid codeword. Analogously, in some embodiments, at step 313 each parity check equation, associated with a row of parity check matrix H may be evaluated using the vector ṽ. In other embodiments, at step 313 each parity check equation, associated with a row of parity check matrix H which does not have a 1 in the guessed position may be evaluated using the vector ṽ. The result of this may be called a "parity check." For each such equation, if the modulo two result of this parity check is 0, then the parity check equation may be satisfied and ṽ may possibly be a valid codeword, otherwise the parity check equation may be violated and ṽ may not be a valid codeword.

At step 314, the number parity check violations (i.e. the number of violated parity check equations) for the guessed position may be determined. This may be, for example, equal to the number of parity check equations for which the modulo two result is not 0. In other embodiments, at step 314, the ratio of the number of parity check violations (i.e. the number of violated parity check equations) for the guessed position to the total number of parity check equations associated with rows of parity check matrix H which do not have a 1 in the guessed position may be determined.

At step 315, it may be determined if all possible positions for the insertion in the received vector v have been guessed. If all positions have been guessed then process 310 may be completed. Otherwise, step 316 may be executed.

At step 316, the guessed position may be incremented by one bit position. Process 310 may then execute step 312.

Process 310 may be completed, for example, once all possible guesses of bit positions for the insertion in v have been considered. In some embodiments, the number of violated parity check equations for each possible bit position in v, may be determined. In other embodiments, the ratio of the number of parity check violations for each possible bit position to the total number of parity check equations associated with rows of parity check matrix H which do not have a 1 in the bit position (ratio of parity check violations) may be determined. There may be multiple ways to determine the possible positions where the insertion occurred. For example, in some embodiments, it may be determined that the bit positions corresponding to the smallest number of violated parity check equations may be possible positions where the insertion occurred in v. For example, in other embodiments, it may be determined that the bit position corresponding to the smallest ratio of parity check violations may be possible positions where the insertion occurred in v.

As another example, in some embodiments, it may be determined that the first bit position found corresponding to the number of violated parity check equations being less than a threshold may be the possible position where the insertion occurred in v. There may be many violated parity check equations if the guessed position of the insertion is not the actual position of the insertion. However, there may only be a few violated parity check equations if the guessed position of the insertion is the actual position of the insertion. A threshold may therefore be set for the number of violated parity check equations associated with a guessed position, below which, the guessed position is deemed to be the actual position of the insertion. Using such a threshold may correctly identify the actual position of the insertion and also may reduce the time to search and find this position.

In practice, one or more steps shown in process 310 may be combined with other steps, performed in any suitable order, performed in parallel (e.g., simultaneously or substantially simultaneously), or removed.

In some embodiments, process 310 may be extended to assist in locating multiple insertions in a received vector v, using a LDPC parity check matrix. For example, the new process may guess that the positions of the two or more inserted bits are correspondingly in two or more bit positions of v. The new process may then delete the bits in these guessed locations. Each placeholder bit may be, for example, a '0' or a '1'. In some embodiments, using the resulting vector, the number of violated parity check equations corresponding to rows of a parity check matrix H which do not have a 1 in the guessed positions may then be determined. In other embodiments, using the resulting vector, the number of violated parity check equations corresponding to all rows of a parity check matrix H may then be determined. The number of violated parity check equations may similarly be determined exhaustively for all possible guesses of positions of inserted bits. In some embodiments, the set of bit positions corresponding to the smallest values for the number of violated parity check equations may be identified as the possible positions where the insertions occurred in v. In other embodiments, it may be determined that the first set of bit positions guessed corresponding to the number of violated parity check equations being less than a threshold may be the possible positions where the insertions occurred in v.

In some embodiments, prior to determining the position or positions of inserted or deleted bits in a received vector and prior to decoding the received vector using a LDPC decoder (e.g., using LDPC decoder 116 of FIG. 1), it may be necessary to make a hard decision for a LLR received corresponding to each received bit from, for example, a channel detector. This may be necessary because while the input to the LDPC decoder may be a collection of LLR values, to determine the position or positions of inserted or deleted bits, the bit-string corresponding to the collection of LLR values may be necessary. For example, the string of LLR values "−2 3 −5 6 2 1 4 −1 5" may correspond to the hard decisions "1 0 1 0 0 0 0 1 0." This bit-string of hard decisions may in turn correspond to the received vector v=[1, 0, 1, 0, 0, 0, 0, 1, 0]. After determining the possible positions of an inserted bit or set of bits in the received vector v, the LLR values corresponding to these positions may be removed. Similarly, after determining the possible positions of a deleted bit or set of bits in the received vector v, LLR values corresponding to these positions may be inserted. Each of these inserted LLR values may be set to 0, since the value(s) of the deleted bit or set of deleted bits may be unknown. In some cases, it may be necessary to set LLR values in the neighborhood of each possible position of an insertion or a deletion to 0 because the quality of these LLR values may be bad.

FIG. 4A shows an illustrative example of quasi-cyclic parity check matrix 401 in a block matrix representation in accordance with some embodiments. As an extension to the processes described above to determine the positions of insertions or deletions in a received vector, a structured LDPC code parity check matrix, such as a quasi-cyclic parity check matrix, may be used in place of a regular parity check matrix. This technique may be used to locate at the block level an insertion or deletion occurring within a block column (block) of consecutive bits in the received vector rather than an insertion or a deletion at particular bit positions. This technique may also be used to speed up the process of locating an insertion or a deletion. Rather than determining the exact positions of the insertion or the deletion, this technique may be used to determine the approximate possible positions of the insertion or deletion (e.g., the position of the block that the insertion or deletion occurred within).

A block matrix representation is a compact way for describing a matrix that may contain a large number of elements. The block matrix representation is equivalent to the normal matrix representation, but may be advantageous in illustrating the structure of a possibly large matrix without the necessity of explicitly listing each element in the matrix.

A quasi-cyclic LDPC code representation is defined by the characteristic that the parity check matrix for that particular code is quasi-cyclic. A quasi-cyclic parity check matrix in a block matrix representation may be made up of circular sub-matricies known as circulants. Circulant 404, labeled $H_i$, is one such matrix. Circulant 404 is a square matrix—i.e. circulant 404 has the same number of rows as columns. This number is commonly referred to as the circulant size $S_c$. In addition, circulants have the property that each row is a cyclic shift of the previous row by one. For brevity, the phrase "non-zero circulant" will be used to refer any circulant matrix, $H_i$, that is not the all-zero matrix. Similarly, the phrase "zero circulant" will be used to refer to any circulant matrix, $H_i$, that is the all-zero matrix. Some quasi-cyclic LDPC code representations may have associated parity check matrices which have many zero circulants. Recall that parity check matrix 401 is of size [r×n]. Thus, the size of the block matrix is $[r_m=r/S_c \times n_m=n/S_c]$, where $S_c$, r, and n are chosen so that $r_m$ and $n_m$ are integers.

If a quasi-cyclic representation of parity check matrix is used, then the implementation of LDPC encoder 104 and of LDPC decoder 116, may be significantly simplified. One reason for this is that a quasi-cyclic parity check matrix may be much easier to store, since only the first row/column of each circulant matrix needs to be stored in order to generate the entire circulant.

In some embodiments, a quasi-cyclic parity check matrix, H, with circulants of size $S_c$ (e.g. quasi-cyclic parity check matrix 401) may be used to determine the approximate positions of a deletion in a received vector v. The received vector v, may have multiple blocks. The position of the block which contains the deletion may be guessed. For example, the initial guess may be the first block position. This block (e.g. of size $S_c$-1 bits) may be deleted and a placeholder block of bits of size $S_c$ may be inserted in the guessed position in v compensate for the deletion. The placeholder block may consist of $S_c$ '0's and/or '1's. Using the resulting vector, the number of violated parity check equations corresponding to the rows of the parity check matrix, H, in which there is a zero circulant in the guessed position, may then be determined. The number of violated parity check equations may similarly be determined, exhaustively, for all possible guesses of positions of the deletion. For example, the guessed position may be incremented by one position and the number of violated check equations may be determined for the guessed position until all possible positions have been guessed. The positions of blocks corresponding to the smallest value for the number of violated parity check equations may be identified as the approximate possible positions where the deletion occurred in v. After determining the positions of these blocks in the received vector v, the LLR values corresponding to the bits within these blocks may be inserted. Each inserted LLR value may be set to 0, since the bit value of the deletion may be unknown.

Similarly, in some embodiments, a quasi-cyclic parity check matrix, H, with circulants of size $S_c$ may be used to determine the approximate positions of an insertion in a received vector v. The received vector v, may have multiple blocks. The position of the block which contains the insertion may be guessed. For example, the initial guess may be the first block position. This block (e.g., of size $S_c$+1 bits) may be deleted and a placeholder block of bits of size $S_c$ may be inserted in the guessed position in v to eliminate the insertion. The placeholder block may consist of $S_c$ '0's and/or '1's. Using the resulting vector, the number of violated parity check equations corresponding to, for example, the rows of the parity check matrix, H, in which there is a zero circulant in the guessed position, may then be determined. Using the resulting vector, the number of violated parity check equations corresponding to, for example, all of the rows of the parity check matrix H may then be determined. The number of violated parity check equations may similarly be determined, exhaustively, for all possible guesses of positions of the insertion. For example, the guessed position may be incremented by one position and the number of violated check equations may be determined for the guessed position until all possible positions have been guessed. The positions of blocks corresponding to the smallest value for the number of violated parity check equations may be identified as the approximate possible positions where the insertion occurred in v. After determining the positions of these blocks in the received vector v, LLR values corresponding to the bits within these blocks may be deleted and a new set of LLR values may be inserted. Each inserted LLR value may be set to 0.

The above techniques may be used to exhaustively guess block positions of an insertion or a deletion and therefore to determine the approximate positions of the insertion or the deletion in the received vector, v. In some embodiments these techniques may be extended so that multiple blocks may be grouped into a set of groups. The above techniques may then be used to determine which group, rather than which block, contains the insertion or the deletion.

As an example, quasi-cyclic parity check matrix 401 may be used to determine the approximate positions of an insertion or a deletion in a received vector, v. Quasi-cyclic parity check matrix 401 in a block matrix representation may be of size $[r_m=5, n_m=10]$ which implies that it may have 5×10=50 circulants. Each block column of quasi-cyclic parity check matrix 401 may have two non-zero circulants and three zero circulants. The circulant size of each circulant in quasi-cyclic parity check matrix 401 may be $S_c=8$, which implies that the codeword length (e.g. the length of codeword 106 of FIG. 1) may be n=80 bits. In this case, searching for a deletion or an insertion by exhaustively guessing a position in terms of bit position in which a deletion or an insertion occurred in v (e.g. using multiple iterations of process 300 of FIG. 3) may involve searching 80 different bit positions. However, using the techniques described above to exhaustively guess block positions of an insertion or a deletion and to determine the approximate block positions of the insertion or the deletion in the received vector, v, may reduce the searching to 10 different positions.

Figure 4B:
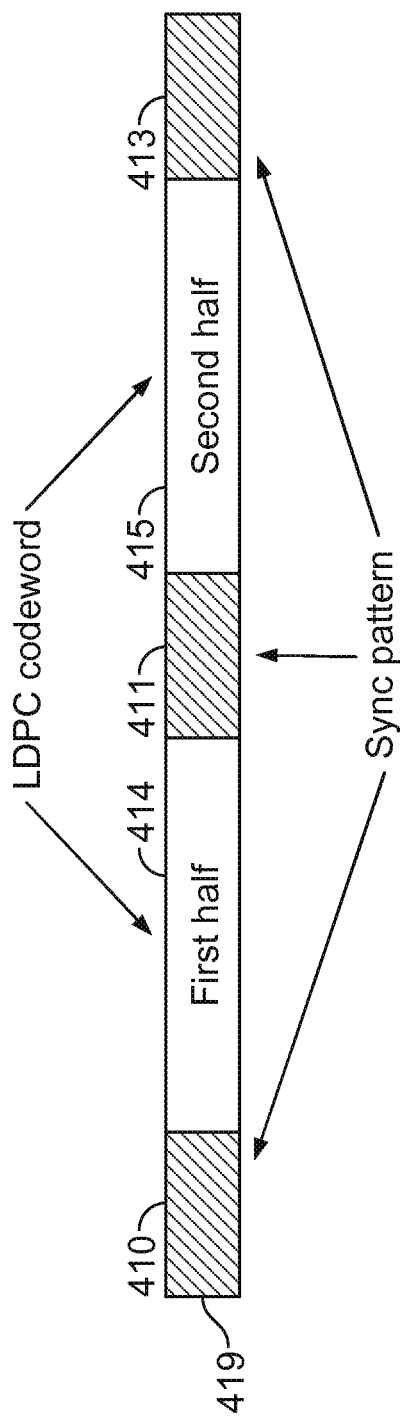
FIG. 4B shows an illustrative example of a LDPC codeword with inserted sync patterns in accordance with some embodiments.

FIG. 4B shows an illustrative example of LDPC codeword 419 with inserted sync patterns in accordance with some embodiments. LDPC codeword 419 may include first half of the codeword 414 and second half of the codeword 415. LDPC codeword 419 may be similar to codeword 106 of FIG. 1, but may have "sync patterns" inserted at the beginning, middle, and/or end of the codeword. For example, sync pattern 410 is inserted at the beginning of LDPC codeword 419, sync pattern 411 is inserted in the middle of LDPC codeword 419, and sync pattern 413 is inserted at the end of LDPC codeword 419. Each sync pattern may be a preset sequence of bits. Modulator 108 of FIG. 1 may prepare LDPC codeword 419 and the inserted sync patterns for transmission on, for example, channel 110 of FIG. 1. Once LDPC codeword 419 and the sync patterns are transmitted and then subsequently received by, for example, demodulator 112 of FIG. 1, the inserted sync patterns may be identified. The sync patterns may help in determining the number of insertions or deletions in the received vector upon its reception. This may be done by identifying the number of bits that are present in between the sync patterns upon their reception.

As an example, a codeword may have a sync pattern inserted at the beginning and at the end. This codeword and the sync patterns may be transmitted on a channel (e.g. channel 110 of FIG. 1) to a receiver. The receiver may locate the inserted sync patterns and it may determine the number of bits in between the sync patterns. The receiver may then know how many insertions or how many deletions may have occurred. For example, if the number of bits in between the sync patterns is one larger than the standard codeword length, then the receiver may decide that one insertion has occurred and may act accordingly (e.g. by using process 310 of FIG. 3B to locate the insertion). Sync patterns may also be inserted in the middle of a codeword (e.g. LDPC codeword 419). These patterns may help determine the number of insertions or deletions and may also help locate approximately where the insertions or deletions occurred in the received vector corresponding to the codeword. This may lead to a reduction in time required to search for the positions of the insertion or deletions.

Figure 4C:
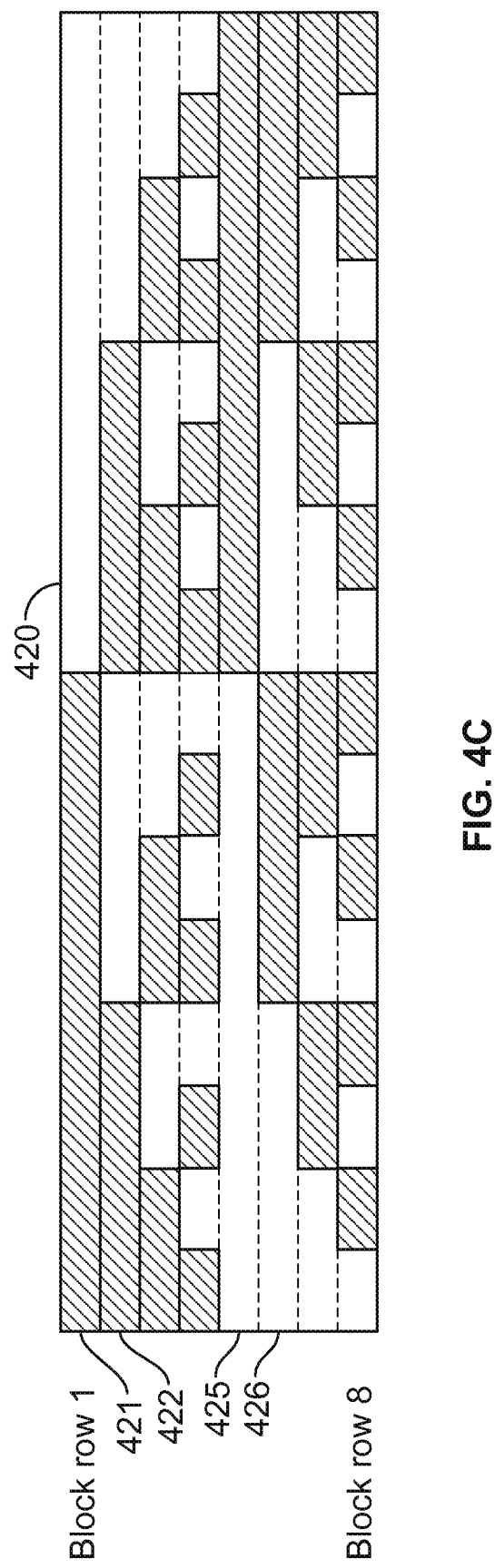
FIG. 4C shows an illustrative example of a LDPC parity check matrix designed to simplify the search for an insertion or a deletion in accordance with some embodiments.

FIG. 4C shows an illustrative example of LDPC parity check matrix 420 in a block matrix representation designed to simplify the search for an insertion or a deletion in accordance with some embodiments. LDPC parity check matrix 420 may have multiple block rows. For example, it may have block rows 421, 422, 425, and 426. Each of these block rows may contain multiple zeros or multiple ones. For example, the white area in each block row my correspond to zero entries while the shaded area of each block row may correspond to nonzero entries.

LDPC parity check matrix 420 may be used to locate, for example, a deletion or an insertion in a received vector, v. For example, block row 421 of LDPC parity check matrix 420 may have non-zero circulants in its first half and zero circulants in its second half. Block row 425 of parity check matrix 420 may have non-zero entries in its second half and zero entries in its first half. Therefore, the parity check equations corresponding to block row 421 may involve only the bits corresponding to the first half of a received vector, v (e.g., associated with a transmitted codeword). Parity check equations corresponding to block row 425 may involve only the bits corresponding to the second half of the received vector, v.

It may be guessed that the deletion or the insertion is in the second half of the received vector, v. Then, the result of the parity check equations associated with block row 421 may be checked using the received vector, v. As a result, if the number of parity check equations that are violated is less than a threshold number of violations, then it may be determined that the initial guess that the deletion or the insertion is in the second half of the received vector, v, may be correct. Searching for the deletion or the insertion may continue in the second half of v. For example, it may be guessed that the deletion or the insertion is in the fourth quarter of v. Then, the result of the parity check equations associated with block row 422 may be checked using v. As a result, if the number of parity check equations that are violated is less than a threshold number of violations, then it may be determined that the guess that the deletion or the insertion is in the fourth quarter of v may be correct. Searching may continue in this fashion until the position of the deletion or the insertion in v is found.

If at the initial search step, the number of parity check equations associated with block row 421 that are violated is not less than a threshold number of violations, then it may be determined that the initial guess that the deletion or the insertion is in the second half of the received vector, v, may be incorrect. In this case, the search for the deletion or the insertion may continue in the first half of v, for example parity check equations associated with block rows 422 and 426 may be checked.

In general, at each search step, a guess may be made for the position of the deletion or the insertion in the received vector and parity check equations associated with block rows containing zero circulants in the guessed location may be evaluated. Performing a search for a deletion or an insertion in this way may significantly reduce the time to find the deletion or the insertion.

Those skilled in the art will appreciate that the invention can be practiced by other than the described embodiments, which are presented for the purpose of illustration rather than of limitation.

What is claimed is:

1. A method for locating from a hard disk drive at least one position associated with an alteration in a received vector, the alteration being located using a parity check matrix associated with a low density parity check (LDPC) codeword in a LDPC decoder, the method comprising:
for each position of a plurality of positions in the received vector from the hard disk drive, determining a number of parity check violations for an altered vector created based on the each position of the plurality of positions in the received vector and the parity check matrix; and
comparing the numbers of parity check violations to each other to locate the at least one position associated with the alteration in the received vector from the hard disk drive using decoding circuitry, wherein the comparing the numbers is to find the smallest of a numbers.

2. The method of claim 1, wherein the alteration is a deletion in the received vector from the hard disk drive.

3. The method of claim 1, wherein the alteration is an insertion in the received vector from the hard disk drive.

4. The method of claim 1, wherein comparing the numbers of parity check violations comprises determining the at least one position associated with the alteration having one of a smallest number of parity check violations.

5. The method of claim 1, further comprising locating a plurality of alterations in the received vector from the hard disk drive.

6. The method of claim 1, wherein determining the number of parity check violations comprises determining a value for a check equation associated with a row of the parity check matrix.

7. The method of claim 1, wherein the LDPC codeword and the received vector contain sync patterns used to determine a number of alterations in the received vector.

8. Decoding circuitry for locating from a hard disk drive at least one position associated with an alteration in a received vector, the alteration being located using a parity check matrix associated with a low density parity check (LDPC) codeword in a LDPC decoder, the decoding circuitry configured to:
for each position of a plurality of positions in the received vector from the hard disk drive, determine a number of parity check violations for an altered vector created based on the each position of the plurality of positions in the received vector and the parity check matrix; and compare the numbers of parity check violations to each other to locate the at least one position associated with the alteration in the received vector from the hard disk drive, wherein the numbers are compared to find a smallest of the numbers.

9. The decoding circuitry of claim 8, wherein the alteration is a deletion in the received vector from the hard disk drive.

10. The decoding circuitry of claim 8, wherein the alteration is an insertion in the received vector from the hard disk drive.

11. The decoding circuitry of claim 8, further configured to determine the at least one position associated with the alteration having one of a smallest number of parity check violations.

12. The decoding circuitry of claim 8, further configured to locate a plurality of alterations in the received vector from the hard disk drive.

13. The decoding circuitry of claim 8, further configured to determine a value for a check equation associated with a row of the parity check matrix.

14. The decoding circuitry of claim 8, wherein the LDPC codeword and the received vector from the hard disk drive contain sync patterns used to determine a number of alterations in the received vector from the received vector.

15. Decoding circuitry for locating from patterned media at least one position associated with an alteration in a received vector, the alteration being located using a parity check matrix associated with a low density parity check (LDPC) codeword in a LDPC decoder, the decoding circuitry configured to:

for each position of a plurality of positions in the received vector from the patterned media, determine a number of parity check violations for an altered vector created based on the each position of the plurality of positions in the received vector and the parity check matrix; and compare the numbers of parity check violations to each other to locate the at least one position associated with the alteration in the received vector from the patterned media, wherein the numbers are compared to find a smallest of the numbers.

16. The decoding circuitry of claim 15, wherein the alteration is a deletion in the received vector from the patterned media.

17. The decoding circuitry of claim 15, wherein the alteration is an insertion in the received vector from a hard disk drive.

18. The decoding circuitry of claim 15, further configured to determine the at least one position associated with the alteration having one of a smallest number of parity check violations.

19. The decoding circuitry of claim 15, further configured to locate a plurality of alterations in the received vector from the patterned media.

20. The decoding circuitry of claim 15, further configured to determine a value for a check equation associated with a row of the parity check matrix.

\* \* \* \* \*